United States Patent [19]
Lenz et al.

[11] Patent Number: 5,569,356
[45] Date of Patent: Oct. 29, 1996

[54] ELECTRODE CLAMPING ASSEMBLY AND METHOD FOR ASSEMBLY AND USE THEREOF

[75] Inventors: Eric H. Lenz, San Jose; Michael L. Calvisi, Union City; Ivo A. Miller, San Jose; Robert A. Frazier, Fremont, all of Calif.

[73] Assignee: LAM Research Corporation, Fremont, Calif.

[21] Appl. No.: 445,292

[22] Filed: May 19, 1995

[51] Int. Cl.⁶ .................................................. H01L 21/00
[52] U.S. Cl. ..................... 156/643.1; 156/657.1; 156/345; 216/67
[58] Field of Search ............................. 156/345 P, 643.1, 156/657.1, 659.1, 662.1; 216/2, 67, 68, 69, 70, 71, 79; 204/192.32, 192.37, 298.31, 298.38, 298.39

[56] References Cited

U.S. PATENT DOCUMENTS

| | | |
|---|---|---|
| 4,534,816 | 8/1985 | Chen et al. . |
| 4,595,484 | 6/1986 | Giammarco et al. . |
| 4,792,378 | 12/1988 | Rose et al. . |
| 4,820,371 | 4/1989 | Rose . |
| 4,960,488 | 10/1990 | Law et al. . |
| 5,074,456 | 12/1991 | Degner et al. ................. 156/345 P X |
| 5,089,083 | 2/1992 | Kojima et al. ................. 156/345 P X |
| 5,180,467 | 1/1993 | Cook et al. ................... 156/345 P X |
| 5,423,936 | 6/1995 | Tomita et al. ................... 156/345 P |

*Primary Examiner*—William Powell
*Attorney, Agent, or Firm*—Burns, Doane, Swecker & Mathis, L.L.P.

[57] ABSTRACT

An electrode clamping assembly for a plasma reaction chamber wherein processing of a single wafer can be carried out. The electrode assembly includes a support member, an electrode such as a silicon showerhead electrode in the form of a disk having uniform thickness and a clamping ring which provides a resilient clamping force pressing against the showerhead electrode. The clamping member can be a ring of elastically deformable material and the clamping member can be tightened by a plurality of elastic spaced-apart bolts such that the clamping member is compressed and provides the resilient clamping force throughout temperature cycling of the electrode assembly during wafer processing. Heat conduction between the showerhead electrode and the support member can be improved by supplying pressurized process gas to a gap therebetween. The clamping member also provides plasma confinement in an area between the electrode and the wafer being processed.

29 Claims, 3 Drawing Sheets

ELECTRODE CLAMPING ASSEMBLY AND METHOD FOR ASSEMBLY AND USE THEREOF

BACKGROUND OF THE INVENTION

1. Field of the Invention

The invention relates to an apparatus for plasma processing of semiconductor wafers, and more particularly, to an electrode assembly wherein the electrode is resiliently clamped to a support member. The invention also relates to a process of assembling the electrode and a process of etching a wafer with the electrode assembly.

2. Description of the Related Art

Dry plasma etching, reactive ion etching, and ion milling techniques were developed in order to overcome numerous limitations associated with chemical etching of semiconductor wafers. Plasma etching, in particular, allows the vertical etch rate to be made much greater than the horizontal etch rate so that the resulting aspect ratio (i.e., the height to width ratio of the resulting notch) of the etched features can be adequately controlled. In fact, plasma etching enables very fine features with high aspect ratios to be formed in films approaching 1 micrometer in thickness.

During the plasma etching process, a plasma is formed above the masked surface of the wafer by adding large amounts of energy to a gas at relatively low pressure, resulting in ionizing the gas. By adjusting the electrical potential of the substrate to be etched, charged species in the plasma can be directed to impinge substantially normally upon the wafer, wherein materials in the unmasked regions of the wafer are removed.

The etching process can often be made more effective by using gases that are chemically reactive with the material being etched. So called "reactive ion etching" combines the energetic etching effects of the plasma with the chemical etching effect of the gas. However, many chemically active agents have been found to cause excessive electrode wear.

It is desirable to evenly distribute the plasma over the surface of the wafer in order to obtain uniform etching rates over the entire surface of the wafer. For example, U.S. Pat. Nos. 4,595,484, 4,792,378, 4,820,371, 4,960,488 disclose showerhead electrodes for distributing gas through a number of holes in the electrodes. These patents generally describe gas dispersion disks having an arrangement of apertures tailored to provide a uniform flow of gas vapors to a semiconductor wafer.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$ and $SF_6$ or mixtures thereof with $O_2$, $N_2$, He or Ar is introduced into the etching chamber and maintained at a pressure which is typically in the millitorr range. The upper electrode is provided with gas holes which permit the gas to be uniformly dispersed through the electrode into the chamber. The electric field established between the anode and the cathode will dissociate the reactive gas forming a plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched side walls.

A showerhead electrode assembly 10 for a single wafer etcher is shown in FIG. 1. Such a showerhead electrode 10 is typically used with a convex bottom electrode on which an 8 inch wafer is supported spaced 1 to 2 cm below the electrode 10. The convex shape of the bottom electrode compensates for the bow of the wafer due to applying He pressure to the backside of the wafer which, if not compensated for, will have a weaker plasma field and poorer heat transfer in center. The degree of convexity of the bottom electrode can range from 35 to 50 mils and additional compensation for the weaker plasma field below the center of electrode 10 can be achieved by lowering He pressure applied to the backside of the wafer to increase RF coupling of the plasma to the center of the wafer.

The upper surface of the outer edge of the silicon electrode 10 is metallurgically bonded by In solder to a graphite supporting ring 12. The electrode 10 is a planar disk having uniform thickness from center to edge thereof. An outer flange on ring 12 is clamped by an aluminum clamping ring 16 to an aluminum support member 14 having water cooling channels 13. A plasma confinement ring 18 comprised of a Teflon® support ring 18a and an annular Vespel® insert 18b surrounds the outer periphery of electrode 10. The purpose and function of confinement ring 18 is to increase the electrical resistance between the reaction chamber walls and the plasma thereby confining the plasma between the upper and lower electrodes. The clamping ring 16 is attached to support member 14 by twelve circumferentially spaced apart stainless steel bolts 17 threaded into support member 14 and the plasma confinement ring 18 is attached to clamping ring 16 by six circumferentially spaced apart bolts 19 threaded into ring 16. A radially inwardly extending flange of clamping ring 16 engages the outer flange of graphite support ring 12. Thus, no clamping pressure is applied directly against the exposed surface of electrode 10.

Process gas is supplied to electrode 10 through a central hole 20 in the support member 14. The gas then is dispersed through one or more vertically spaced apart baffle plates 22 and passes through gas dispersion holes (not shown) in the electrode 10 to evenly disperse the process gas into reaction chamber 24. In order to provide enhanced heat conduction between ring 12 and support member 14, part of the process gas is supplied through gas passage 27 to fill a small annular groove in support member 14. In addition, gas passage 26 in confinement ring 18 permits pressure to be monitored in the reaction chamber 24. To maintain process gas under pressure between support member 14 and ring 12, a first O-ring seal 28 is provided between a radially inner surface of support ring 12 and a radially outer surface of support member 14 and a second O-ring seal 29 is provided between an outer part of an upper surface of ring 12 and a lower surface of support member 14.

The process of bonding the silicon electrode 10 to the supporting ring 12 requires heating of the electrode to a bonding temperature which may cause bowing or cracking of the electrode due to the different thermal coefficients of expansion of the silicon electrode 10 and the graphite ring 12. Also, contamination of wafers could result from solder particles or vaporized solder contaminates deriving from the joint between electrode 10 and ring 12 or from the ring itself. The temperature of the electrode may even become high enough to melt the solder and cause part or all of the electrode 10 to separate from the ring 12. However, even if the electrode 10 becomes partly separated from ring 12, local variations in electrical and thermal power transmission between ring 12 and electrode 10 could result in nonuniform plasma density beneath the electrode 10.

SUMMARY OF THE INVENTION

The invention provides an electrode assembly of a plasma reaction chamber for wafer processing. The electrode assembly includes a support member having a lower surface facing a wafer to be processed in the reaction chamber, an electrode and a clamping member. The electrode has a lower surface facing the wafer and an upper surface of an outer edge of the electrode faces the lower surface of the support member. The clamping member engages the outer edge of the electrode and provides a resilient clamping force pressing the electrode against the support member.

According to a preferred embodiment, the electrode comprises a showerhead electrode and the support member includes a gas passage supplying a process gas to the upper surface of the electrode. In this case, the support member optionally can include a cavity and one or more baffle plates located in the cavity whereby the gas passage supplies process gas at a first pressure into a space between the lower surface of the support member and an upper surface of the uppermost baffle. The support member can also include a gas passage having a restriction therein for supplying process gas at a second pressure higher than the first pressure into a gap between an outer portion of the upper surface of the electrode and the lower surface of the support member. A pair of seals such as O-ring seals on opposite sides of the gap can be located between the electrode and the support member such that the seals extend around the outer edge of the electrode. The electrode can comprise a silicon disk of uniform or nonuniform thickness and the clamping member can comprise a ring of dielectric material having a radially inwardly extending flange which presses against an outer portion of an exposed surface of the electrode.

In the preferred embodiment, the clamping member comprises a ring having a radially inwardly extending flange in contact with the outer edge of the electrode and pressing the outer edge of the electrode against the lower surface of the support member. The clamping member can include a gas passage for monitoring gas pressure in an area adjacent an exposed surface of the electrode. A seal such as an O-ring seal can be located between the clamping member and the support member such that the seal surrounds the gas passage in the clamping member. In order to provide the resilient clamping force, the clamping member can be of a compressible synthetic resin material which is stable in the plasma environment of the plasma reaction chamber. Alternatively, the clamping member can be of a noncompressible material attached to the support member by a compressible member such as a plurality of bolts of compressible synthetic resin material.

The invention also provides a method of assembling a showerhead electrode assembly of a plasma reaction chamber. The method includes arranging a support member having a gas passage supplying a process gas to a lower surface of the support member and a showerhead electrode having an outer edge such that an upper surface of the outer edge of the showerhead electrode faces the lower surface of the support member. The method further includes engaging a clamping member with the outer edge of the showerhead electrode and attaching the showerhead electrode to the support member such that the clamping member provides a resilient clamping force pressing against the showerhead electrode.

The invention also provides a method of processing a wafer in a plasma reaction chamber. The method includes supplying a wafer to the plasma reaction chamber, supplying process gas to a gas passage in a support member mounted in the plasma reaction chamber such that the process gas exits a lower surface of the support member and passes through an exposed lower surface of a showerhead electrode. The method further includes supplying electrical power to the showerhead electrode such that the electrical power passes through an annular contact zone between an upper surface of an outer edge of the electrode and the lower surface of the support member, the electrical power causing the process gas to form a plasma in contact with an upper surface of the wafer. The process also includes confining the plasma in an area above the wafer with a clamping member which engages the outer edge of the showerhead electrode and attaches the showerhead electrode to the support member, the clamping member providing a resilient clamping force pressing against the showerhead electrode during processing of the wafer.

BRIEF DESCRIPTION OF THE DRAWINGS

The invention will now be further described with reference to the figures, wherein.

DETAILED DESCRIPTION OF THE INVENTION

Figure 1:
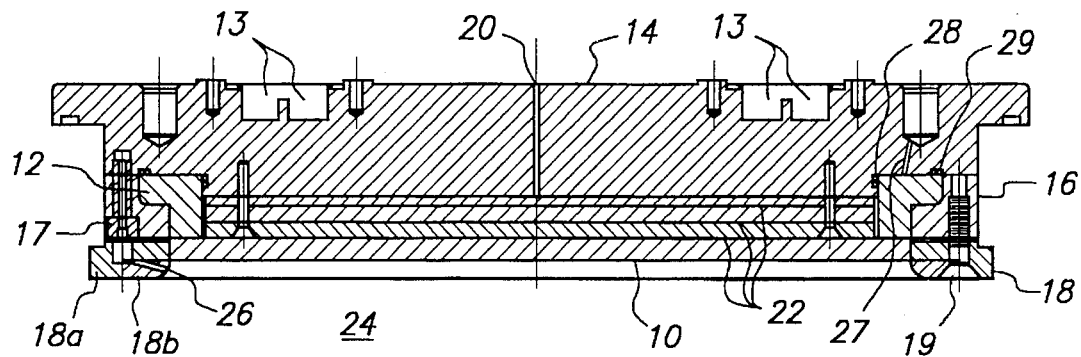
FIG. 1 is a side sectional view of a prior art showerhead electrode assembly for single wafer processing.

The electrode assembly of the invention overcomes disadvantages of the prior art electrode assembly shown in FIG. 1 by providing more uniform cooling of the electrode, improved plasma confinement, lower cost of production and assembly of the electrode, and a greater degree of flatness from the center to the outer periphery of the electrode while maintaining critical dimension (CD) lines within prescribed limits. The electrode assembly is especially useful for wafer etching but could also be used for deposition of layers such as $SiO_2$. The invention also reduces stress in the electrode assembly due to mismatch of coefficients of thermal expansion of the electrode components.

Figure 2:
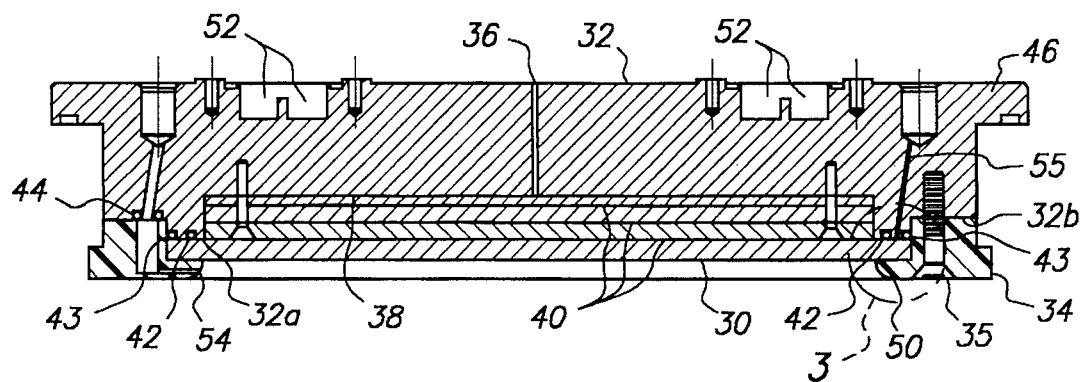
FIG. 2 is a side sectional view of a showerhead electrode assembly according to the present invention.
Figure 3:
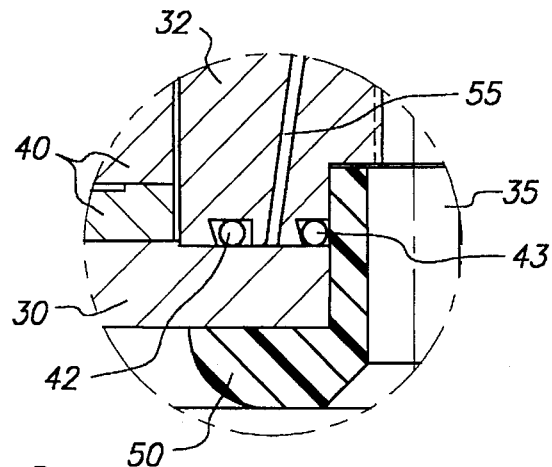
FIG. 3 is an enlarged view of a high pressure gas feed of the showerhead electrode shown in FIG. 2.

A showerhead electrode assembly according to the present invention is shown in FIGS. 2 and 3. The assembly includes an electrode 30, a support member 32, and a plasma confinement ring 34 for clamping the electrode 30 to the support member 32. The ring 34 is attached to support member 32 by twelve circumferentially spaced apart bolts 35 threaded into support member 32. Thus, the invention avoids the need for solder bonding the electrode 30 to a graphite supporting ring which can lead to the various disadvantages discussed above with respect to the arrangement shown in FIG. 1. With respect to plasma confinement, compared to ring 18 in FIG. 1, ring 34 increases the path to ground surrounding the outer periphery of the electrode to provide better plasma confinement.

The support member 32 is provided with a gas passage 36 for providing process gas (e.g., a suitable plasma etching gas for etching silicon dioxide or other layer of material on the wafer) to a lower surface of the support member. The process gas is then distributed through electrode 30 and over a wafer to be processed. The support member 32 is also configured with a lower recess 38 in which three spaced-apart showerhead baffle plates 40 are fitted. The process gas is delivered through the gas passage 36 and through the baffle plates 40 to the electrode 30. The support member 32 is also provided with a radially inner lower surface 32a for engaging the electrode 30 and a radially outer lower surface 32b that maintains close proximity to confinement ring 34. The lower surface 32a of support member 32 contacts the upper surface of electrode 30 and provides electrical power to electrode 30.

The support member 32 includes a radially outwardly extending flange 46 at an upper edge thereof for attachment of the electrode assembly to the interior of a plasma reaction chamber such as the type used for single wafer plasma etching. In the assembled condition, concentric cooling channels 52 in the upper surface of the support member 32 provide water cooling of the electrode assembly.

The electrode 30 preferably consists of an electrically conductive material such as a planar silicon (e.g., single crystal silicon), graphite or silicon carbide electrode disc having uniform thickness from the center to the outer edge thereof. However, electrodes having nonuniform thickness, different materials and/or without process gas dispersion holes could also be used with the electrode assembly according to the invention. In a preferred embodiment, the electrode is a showerhead electrode provided with a plurality of spaced apart gas discharge passages (not shown) which are of a size and distribution suitable for supplying a process gas which is energized by the electrode and forms a plasma in the reaction chamber beneath the electrode.

The plasma confinement ring 34 is provided with a radially inwardly extending flange 50 having an upper surface providing a resilient clamping force against an outer portion of the exposed surface of the electrode 30. The confinement ring 34 is preferably fabricated of a dielectric material such as a heat resistant thermoset plastic (e.g., Vespel® made by Dupont) which is stable in a plasma environment. However, other materials such as ceramic materials comprised of alumina, zirconia, titania, silicon nitride, silicon carbide, etc., or dielectric coated metal could be used for ring 34.

The plasma confinement ring 34 is preferably secured to the support member 32 in a manner so as to resiliently clamp the electrode 30 between the ring 34 and the support member 32. For instance, if the ring 34 is made of Vespel®, the bolts 35 can be tightened at room temperature in an amount sufficient to elastically compress ring 34. During processing of a wafer, the ring 34, electrode 30 and support member 32 heat up and may undergo different degrees of thermal expansion. However, since the ring 34 is elastically compressed, ring 34 continues to provide a resilient clamping force which presses electrode 30 against support member 32 throughout the temperature cycles seen by these components when processing wafers.

According to a preferred embodiment, the ring 34 and bolts 35 are of elastically deformable material such as Vespel®. However, the ring 34 could be of an inelastic material provided the bolts 35 are of elastically deformable material or vice versa. With this arrangement, elastic deformation of the ring 34 and the bolts 35 stores energy in these components and allows the ring 34 to maintain sufficient clamping force under thermal expansion and contraction of the electrode 30, support member 32, confinement ring 34 and bolts 35. The use of a relatively soft, compressible material for ring 34 and long bolts 35 allow these components to deform a large amount while maintaining a soft contact to the electrode 30 and thus avoid damage to the electrode 30. In a preferred embodiment, the Vespel® bolts 35 are of ¼-20 size and when tightened, each of the bolts 35 experiences a load of approximately 100 lbs., i.e., each bolt is stressed to about ¼ of its ultimate tensile strength (12,500 psi). At that load, the bolts elastically deform approximately 0.020 inch and the ring 34 elastically deforms about 0.012 inch, for a total deflection of about 0.032 inch. Because the entire ring/bolt system is maintained within its linear elastic range, the ring 34 will maintain a sufficient clamping force against the Si disk electrode during thermal expansion or contraction of the Si disk or ring/bolt system.

Pressure in the reaction chamber can be monitored via gas passage 54 in the plasma confinement ring 34 which communicates with a suitable pressure sensor connected in a suitable manner to a hollow bolt (not shown) threaded into the back side of support member 32. O-ring 44 surrounding gas passage 54 provides a seal between support member 32 and plasma confinement ring 34. To enhance thermal conduction between electrode 30 and support member 32, process gas is supplied through gas passage 55 and maintained under pressure in an annular channel (not shown) in support member 32 which forms a gap between electrode 30 and support member 32. To maintain the gas under pressure in the gap, inner and outer O-ring seals 42,43 are concentrically arranged on opposite sides of gas passage 55.

In operation, the plasma etching gas which typically may be a mixture of fluorocarbons including $CF_4$, $CHF_3$, Ar and $N_2$, is delivered to the gas passage 36 in the support member 32 and also to the gas passage 55. The process gas which is delivered through the gas passage 36 in the support member 32 is dispersed within the space between the support member and the upper of the baffle plates 40. The gas passes through a series of holes (not shown) in the upper baffle plate, then through the center baffle plate and lower baffle plate and finally through gas dispersion holes (not shown) provided in the electrode 30. In this way the process gas is evenly dispersed across a wafer undergoing processing so as to effect uniform etching of the wafer.

According to the invention, use of a compressible material for the plasma confinement ring 34 and/or bolts 35 offers advantages with respect to reduced likelihood of breakage of electrode 30, improved thermal conduction between electrode 30 and support member 32 during temperature cycling of electrode 30 and improved electrical power supply to the electrode 30 by maintaining good electrical contact between electrode 30, and support member 32. Similar results can be achieved by interposing a ring of compressible material between a ceramic or metal ring 34 and electrode 30, or by coating a metal or ceramic ring 34 with a dielectric compressible material.

Figure 4:
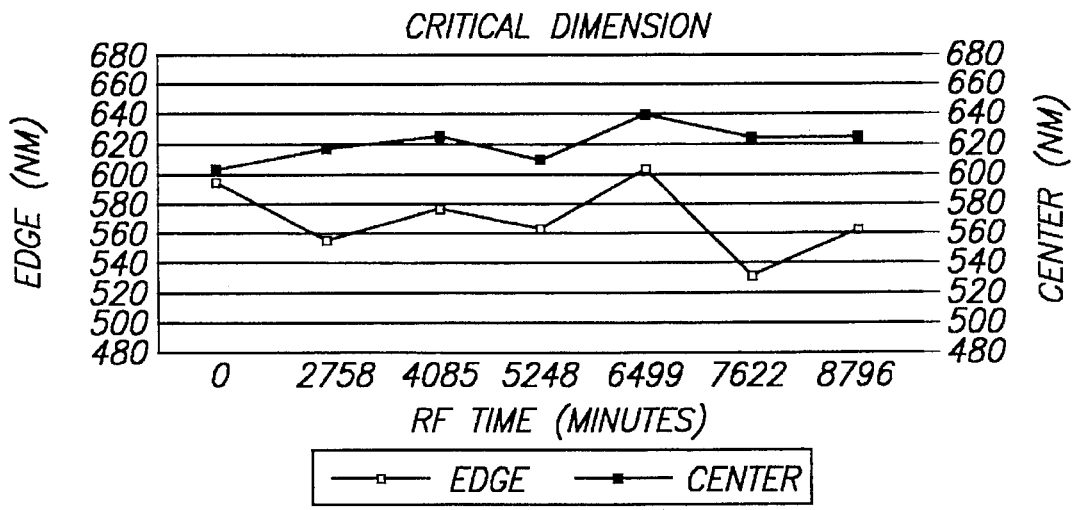
FIG. 4 is a graph of center and edge critical dimension(CD) line dam versus radio frequency (RF) time of operation of a plasma etching chamber utilizing the electrode assembly according to the invention.
Figure 5:
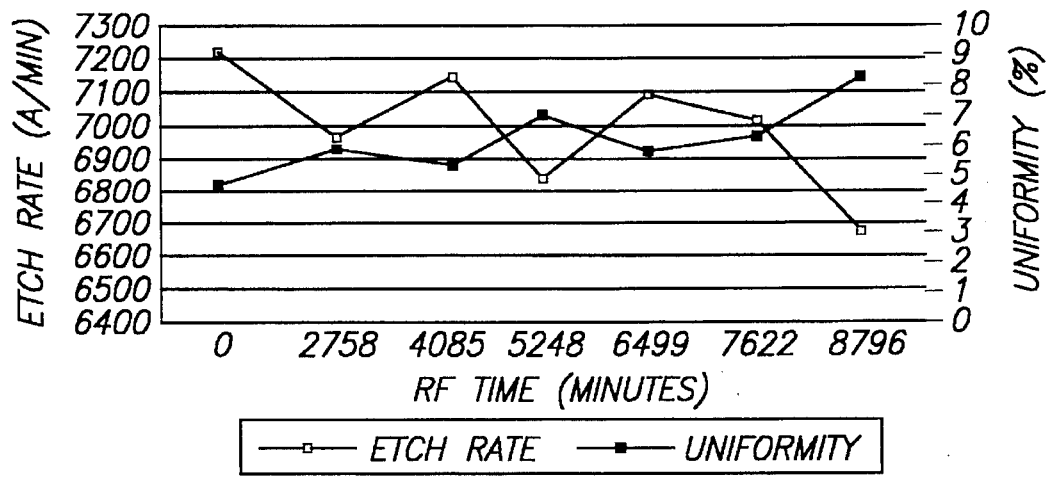
FIG. 5 is a graph of etch rate and uniformity of etching silicon dioxide versus RF time of operation of a plasma etching chamber utilizing the electrode assembly according to the invention.
Figure 6:
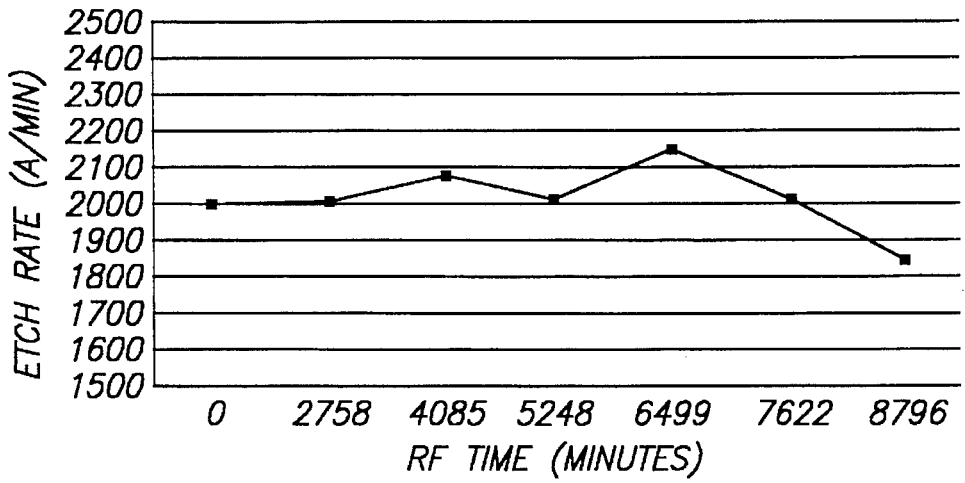
FIG. 6 is a graph of etch rate of a photoresist during via etching versus RF time of operation of a plasma etching chamber utilizing the electrode assembly according to the invention.
Figure 7:
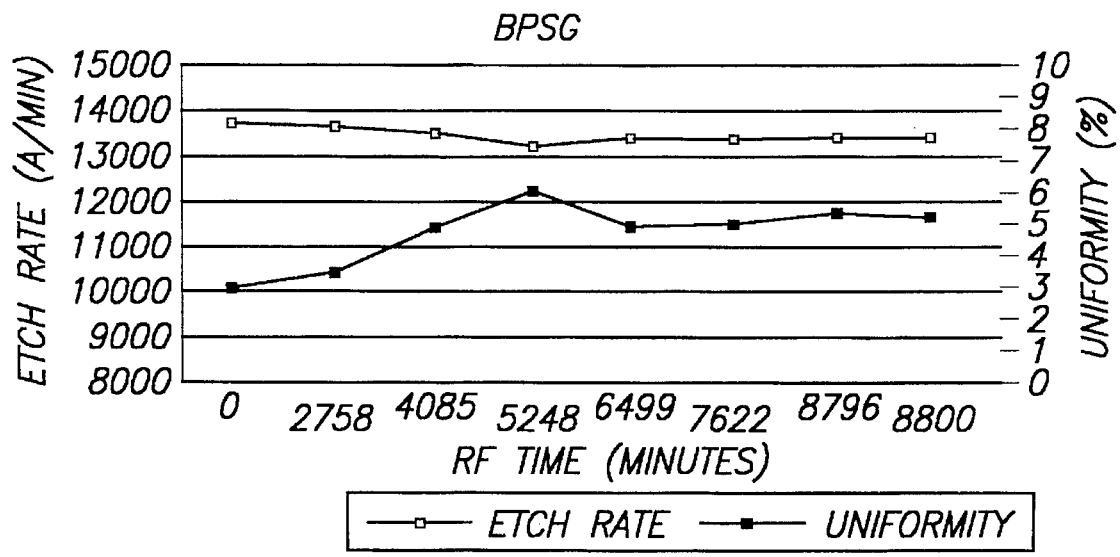
FIG. 7 is a graph of etch rate and uniformity of etching borophosphosilicate glass (BPSG) versus RF time of operation of a plasma etching chamber utilizing the electrode assembly according to the invention.
Figure 8:
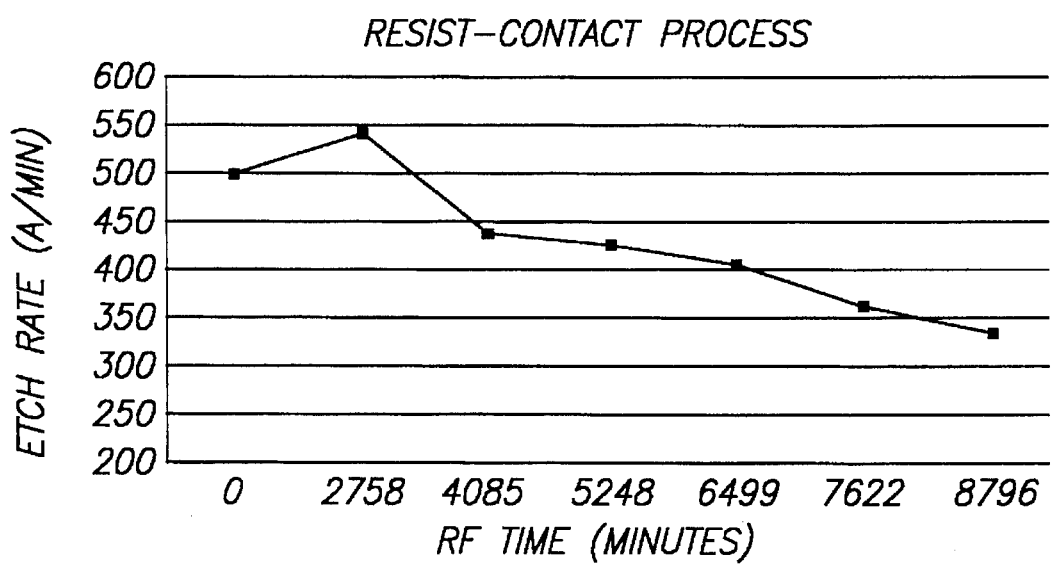
FIG. 8 is a graph of etch rate of a photoresist during a contact etching process versus RF time of operation of a plasma etching chamber utilizing the electrode assembly according to the invention.

The apparatus according to the invention is useful for wafer processing such as plasma etching, deposition, etc., in multiple or single wafer processing. For instance, the apparatus can be used for etching or depositing BPSG, oxides such as thermal silicon dioxide or pyrolytic oxides and photoresist materials. The apparatus as shown in FIG. 2 maintains submicron contact profile, CDs and particle contamination. With respect to etching BPSG, etch rates of about 13500 A/min can be achieved and etch uniformity can be maintained at around 5% for wafer processing runs in excess of 9000 RF minutes whereas the electrode assembly shown in FIG. 1 may require replacement as early as 2400 RF minutes. Photoresist etch rates of about 350 A/min can be maintained while etching silicon dioxide at about 7000 A/min. The resist etch rate during a via etching process can be held steady up to 6500 RF minutes with a steady decline thereafter. With respect to CD line measurement, measurements by SEM of wafers etched for 200 seconds to provide vias in silicon dioxide can provide a center CD which increases by about 0.02 μm and an edge CD which decreases by about 0.03 μm from start to finish. Performance characteristics achievable with the electrode assembly according to the invention are shown in FIGS. 4–8. In particular, FIG. 4 shows resist etch rate in a contact etch process versus time of reactor operation in radio frequency minutes of operation (RF minutes), FIG. 5 shows BPSG etch rate versus RF minutes, FIG. 6 shows resist etch rate in a via etch process versus RF minutes, FIG. 7 shows silicon dioxide etch rate and uniformity versus RF minutes, and FIG. 8 shows CD edge and center dimensions versus RF minutes.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. An electrode assembly of a plasma reaction chamber for wafer processing, comprising:

a support member having a lower surface facing a wafer to be processed in the reaction chamber;

an electrode having a lower surface facing the wafer, the electrode having an upper surface of an outer edge thereof facing the lower surface of the support member; and a clamping member engaging the outer edge of the electrode and resiliently pressing the electrode against the support member.

2. The electrode assembly of claim 1, wherein the electrode comprises a showerhead electrode and the support member includes a gas passage supplying a process gas to the upper surface of the electrode.

3. The electrode assembly of claim 2, wherein the support member includes a cavity and at least one baffle plate located in the cavity, the gas passage supplying process gas into a space between the lower surface of the support member and an upper surface of the baffle adjacent thereto.

4. The electrode assembly of claim 1, wherein the clamping member comprises a ring having a main portion facing the support member and an inwardly extending flange in contact with the outer edge of the electrode and pressing the upper surface of the electrode against the lower surface of the support member.

5. The electrode assembly of claim 4, wherein the flange of the clamping member is axisymmetrically displaced relative to the main portion of the clamping member.

6. The electrode assembly of claim 1, wherein the support member includes a gas passage for supplying process gas into a space between an outer portion of the upper surface of the electrode and the lower surface of the support member.

7. The electrode assembly of claim 6, wherein the process gas in the space is at a higher pressure than the processing gas in the reaction chamber and cools the electrode.

8. The electrode assembly of claim 1, wherein the clamping member includes a gas passage for monitoring gas pressure in an area adjacent an exposed surface of the electrode.

9. The electrode assembly of claim 1, wherein the clamping member is of an elastically deformable material.

10. The electrode assembly of claim 1, wherein the clamping member is of an inelastic material selected from the group consisting of ceramic, metallic, cermet and composite materials.

11. The electrode assembly of claim 1, wherein the clamping member is secured to the support member by a plurality of elastic bolts.

12. The electrode assembly of claim 1, wherein the electrode comprises a thermally and electrically conductive disk and the clamping member comprises a ring of dielectric material having an inwardly extending flange, an upper surface of the flange contacting an outer portion of an exposed surface of the electrode.

13. The electrode assembly of claim 12, wherein the disk comprises single crystal silicon, graphite or silicon carbide.

14. The electrode assembly of claim 8, wherein a first elastic seal is located between the electrode and the support member, the first elastic seal extending around the outer edge of the electrode and a second elastic seal is located between the clamping member and the support member, the second elastic seal surrounding the gas passage in the clamping member.

15. A method of assembling a showerhead electrode assembly of a plasma reaction chamber, comprising:

arranging a support member having a gas passage supplying a process gas to a lower surface of the support member and a showerhead electrode having an outer edge such that an upper surface of the outer edge of the showerhead electrode faces the lower surface of the support member; and engaging a clamping member with the outer edge of the showerhead electrode and attaching the showerhead electrode to the support member such that the clamping member provides a resilient clamping force pressing against the showerhead electrode.

16. The method of claim 15, wherein the showerhead electrode is attached to the support member such that process gas is supplied to a space between the lower surface of the support member and the upper surface of the showerhead electrode, the process gas conducting heat between the showerhead electrode and the support member.

17. The method of claim 15, wherein the clamping member comprises an elastically deformable ring having an inwardly extending flange, the method including placing the flange in contact with the outer edge of the showerhead electrode and elastically deforming the ring such that the outer edge of the showerhead electrode is pressed against the lower surface of the support member.

18. The method of claim 15, wherein the support member includes a cavity, the method including mounting at least one baffle plate in the cavity such that the gas passage supplies process gas into a space between the lower surface of the support member and an upper surface of the baffle plate adjacent thereto.

19. The method of claim 15, wherein the clamping member is of an elastically deformable material, the method including attaching the clamping member to the support member with a plurality of spaced apart bolts and tightening the bolts such that the clamping member is elastically compressed against the showerhead electrode.

20. The method of claim 19, wherein the bolts are of elastically deformable material.

21. The method of claim 15, wherein the showerhead electrode comprises a disk of uniform thickness and the clamping member comprises a ring having a inwardly extending flange, the method including placing an upper surface of the flange in contact with an outer portion of the exposed surface of the showerhead electrode.

22. The method of claim 15, wherein the clamping member is attached to the support member by a plurality of spaced apart bolts of elastically deformable material, the method comprising tightening the bolts such that the bolts are elastically deformed and resiliently clamp the showerhead electrode against the support member.

23. The method of claim 15, wherein the clamping member is of an inelastic material.

24. A method of processing a wafer in a plasma reaction chamber, comprising:

supplying a wafer to the plasma reaction chamber;

supplying process gas to a gas passage in a support member mounted in the plasma reaction chamber such that the process gas exits a lower surface of the support member and passes through an exposed lower surface of a showerhead electrode;

supplying electrical power to the showerhead electrode such that the electrical power passes through a contact zone between an upper surface of an outer edge of the electrode and the lower surface of the support member, the electrical power causing the process gas to form a plasma in contact with an upper surface of the wafer; and confining the plasma in an area above the wafer with a clamping member which engages the outer edge of the showerhead electrode and attaches the showerhead electrode to the support member, the clamping member providing a resilient clamping force pressing against the showerhead electrode during processing of the wafer.

25. The method of claim 24, wherein the support member includes a cavity and at least one baffle plate located in the cavity and the support member includes a gas passage for supplying process gas, the method including supplying process gas into a space between the lower surface of the support member and an upper surface of the baffle plate adjacent thereto and supplying the process gas through the gas passage to a gap between an outer portion of an upper surface of the showerhead electrode and a lower surface of the support member.

26. The method of claim 24, further comprising monitoring gas pressure in an area adjacent an exposed surface of the showerhead electrode through a gas passage in the clamping member.

27. The method of claim 24, wherein the method includes etching a layer of material on the wafer.

28. The method of claim 27, wherein the method includes etching of a silicon dioxide layer on the wafer.

29. The method of claim 24, wherein the method includes depositing a layer of material on the wafer.

* * * * *